United States Patent
Tahara

(10) Patent No.: US 7,355,918 B2
(45) Date of Patent: Apr. 8, 2008

(54) SEMICONDUCTOR MEMORY DEVICE AND REFRESH METHOD THEREOF

(75) Inventor: Kaoru Tahara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/272,792

(22) Filed: Nov. 15, 2005

(65) Prior Publication Data

US 2006/0104140 A1 May 18, 2006

(30) Foreign Application Priority Data

Nov. 16, 2004 (JP) .............................. 2004-332099

(51) Int. Cl.
*G11C 7/00* (2006.01)
*G11C 8/00* (2006.01)

(52) U.S. Cl. .................... 365/222; 365/211; 365/233

(58) Field of Classification Search ............... 365/222, 365/211, 233

See application file for complete search history.

(56) References Cited

U.S. PATENT DOCUMENTS

| 4,209,852 | A | * | 6/1980 | Hyatt .......................... 365/222 |
| 4,616,346 | A | * | 10/1986 | Nakaizumi et al. ......... 365/222 |
| 4,758,993 | A | * | 7/1988 | Takemae .................... 365/222 |
| 5,243,576 | A | * | 9/1993 | Ishikawa .................... 365/222 |
| 5,315,557 | A | * | 5/1994 | Kim et al. .................. 365/222 |
| 5,495,452 | A | * | 2/1996 | Cha ........................... 365/222 |
| 5,828,619 | A | * | 10/1998 | Hirano et al. .............. 365/222 |
| 6,137,743 | A | * | 10/2000 | Kim ............................ 365/222 |
| 6,141,280 | A | * | 10/2000 | Cho ............................ 365/222 |
| 6,199,139 | B1 | * | 3/2001 | Katayama et al. .......... 365/222 |
| 6,618,310 | B2 | * | 9/2003 | Higashiho et al. .......... 365/222 |
| 6,879,536 | B2 | * | 4/2005 | Lee ............................. 365/222 |
| 7,158,434 | B2 | * | 1/2007 | Hokenmaier ................ 365/222 |

FOREIGN PATENT DOCUMENTS

| JP | 5-36274 | 2/1993 |
| JP | 2002-343079 | 11/2002 |
| JP | 2002-373489 | 12/2002 |

* cited by examiner

*Primary Examiner*—Trong Phan
(74) *Attorney, Agent, or Firm*—McGinn IP Law Group, PLLC

(57) ABSTRACT

In a refresh method of a semiconductor memory device, two output pulses having different division ratios are generated by dividing a clock pulse. One of them having a shorter cycle is used to execute a short cycle refresh operation after a self-refresh operation starts. After a predetermined period of time elapses, the other having a longer cycle is used to execute a long cycle refresh operation. When a read/write operation is executed continuously and an element temperature increases, the charges stored in a capacitor of a memory cell are liable to decrease. Accordingly, when an operation mode is switched to a self-refresh mode just after the read/write operation is executed continuously, a refresh operation must be executed at a cycle shorter than an ordinary cycle until temperature is stabilized. After the predetermined period of time elapses, the refresh operation is executed at an ordinary long cycle.

5 Claims, 5 Drawing Sheets

SEMICONDUCTOR MEMORY DEVICE AND REFRESH METHOD THEREOF

This application claims priority to prior Japanese application JP 2004-332099, the disclosure of which is incorporated herein by reference.

BACKGROUND OF THE INVENTION

1. Field of the Invention

The present invention relates to a semiconductor memory device and a refresh method thereof.

2. Description of the Related Art

A dynamic random access memory (hereinafter, referred to as DRAM) is configured as one of semiconductor memory devices. A memory cell used in the DRAM is ordinarily composed of a charge storage capacitor and a MOSFET for controlling input/output to/from the capacitor. Although the information stored in the memory cell is represented by a form of charges stored in the capacitor, since the charges decrease as a time elapses, a refresh operation is necessary to update the stored information at every predetermined time (refresh cycle).

To effectively execute the refresh operation, the semiconductor memory device has a plurality of types of refresh operation modes. The refresh operation modes are, for example, a CBR (CAS before RAS refresh) mode for starting a refresh operation by inputting signals of CAS (column-address strobe) and RAS (row-address strobe), which are supplied from the outside, at a predetermined timing, a self-refresh mode for automatically executing a refresh operation to all the memory cells at a regular interval when the memory device is continuously placed in a waiting state during at least a predetermined period of time, and the like.

In addition to above mentioned refresh operations, a kind of refresh operation is also executed when an ordinary read/write operation is executed. That is, the contents, which are stored in all the memory cells connected to a word line selected to execute the read/write operation, are supplied to the bit lines connected to the memory cells, respectively, and, after the potentials of the bit lines are amplified by a sense amplifier, respectively, the stored contents are restored in the respective memory cells.

A current consumed in these refresh operations depends on time intervals (refresh cycle) of the refresh operations, and the refresh cycle must be increased to reduce the current to be consumed. However, when the refresh cycle is increased, the charges stored in each memory cell are reduced and written information may be lost. Further, a reduction rate of the charges stored in the memory cell depend on the temperature of the memory cell, and the charges tend to decrease faster at a higher temperature.

Accordingly, various countermeasures are employed to effectively execute the refresh operation at a low current consumption. For example, Japanese Unexamined Patent Application Publication No. 05-036274 discloses a technology of a self-refresh mode for executing a first refresh operation at a short refresh cycle and thereafter executing it at a long refresh cycle. Further, Japanese Unexamined Patent Application Publication No. 2002-373489 discloses a technology for setting a different refresh cycle in an automatic refresh operation and in a self-refresh operation in response to a command input to a memory device. Further, Japanese Unexamined Patent Application Publication No. 2002-343079 discloses a technology for measuring a temperature of a semiconductor chip and changing a refresh cycle according to the temperature of the chip.

As described above, a reduction rate of charges stored in a memory cell of a semiconductor memory device depends on temperature. Accordingly, to effectively execute a refresh operation at a low current consumption, it is preferable to execute a refresh operation at a short refresh cycle when a semiconductor device has a high temperature and at a long refresh cycle when it has a low temperature.

However, neither Japanese Unexamined Patent Application Publication Nos. 05-036274 nor 2002-373489 discloses an effective refresh method in consideration of a temperature change of a semiconductor memory device. Therefore, the problem of the effective refresh method in consideration of the temperature change of the semiconductor memory device remains unsolved. Further, the technology disclosed in Japanese Unexamined Patent Application Publication No. 2002-343079 copes with the temperature change of the semiconductor memory device. However, a temperature measuring unit must be newly provided to measure a temperature of a semiconductor chip, from which a new problem arises in that the configuration of the semiconductor memory device is made complex. Thus, a further improvement is desired to execute the refresh operation at a low current consumption in consideration of a temperature change of a semiconductor device.

SUMMARY OF THE INVENTION

Accordingly, an object of the present invention is to provide a refresh method which can be simply and effectively executed at a low current consumption as a refresh method of coping with a temperature change when a continuous read/write operation, by which a high temperature state is created, is stopped and switched to a refresh mode. Further, another object of the present invention is to provide a semiconductor memory device that can execute the refresh method.

Other objects of this invention will become clear as the description proceeds.

According to an aspect of this invention, a refresh method of a semiconductor memory device comprises the steps of generating, when a refresh cycle mode is employed, a first divided pulse and a second divided pulse that has a cycle longer than that of the first divided pulse by a first divider circuit; executing a refresh operation in response to the first divided pulse; measuring a refresh period of time making use of the output level of a second divider circuit; and executing the refresh operation in response to the second divided pulse after the refresh period becomes larger than a predetermined period.

According to another aspect of this invention, a semiconductor memory device comprises a first divider circuit for dividing a clock pulse. A second divider circuit is for dividing the clock pulse in response to an input of a control pulse. A refresh pulse generation circuit is for generating a refresh pulse in response to an output from the first divider circuit and a cycle selection signal. A cycle selection circuit is for generating the cycle selection signal for changing a cycle, at which the refresh pulse is generated, in response to an output from the second divider circuit. A refresh address generator is for generating a refresh address signal in response to the refresh pulse. A decoder is for activating a word line corresponding to the refresh address signal. A memory cell array comprises a plurality of memory cells disposed in an array state and a plurality, of bit lines and word lines connected to the memory cells, respectively.

According to still another aspect of this invention, a refresh method of a semiconductor memory comprises the steps of executing a refresh operation in response to a first divided pulse until a predetermined period of time elapses after a refresh cycle mode is employed; and executing the refresh operation in response to a second refresh pulse whose cycle is longer than that of the first divided pulse after the predetermined period of time elapses. The predetermined period of time is determined based on the temperature characteristics of the semiconductor memory device.

According to still further aspect of this invention, a semiconductor memory device comprises a first divider circuit for generating a first divided clock and a second divided clock having a cycle longer than that of the first divided clock by dividing a clock pulse. A refresh pulse generator is for generating a refresh pulse based on the first divided clock until a predetermined period of time elapses after a control pulse changes to high level and generating a refresh pulse based on the second divided clock after the predetermined period of time elapses.

DESCRIPTION OF THE PREFERRED EMBODIMENTS

A semiconductor memory device and a refresh method thereof of the present invention will be explained below with reference to the figures.

Embodiment 1

Figure 1:
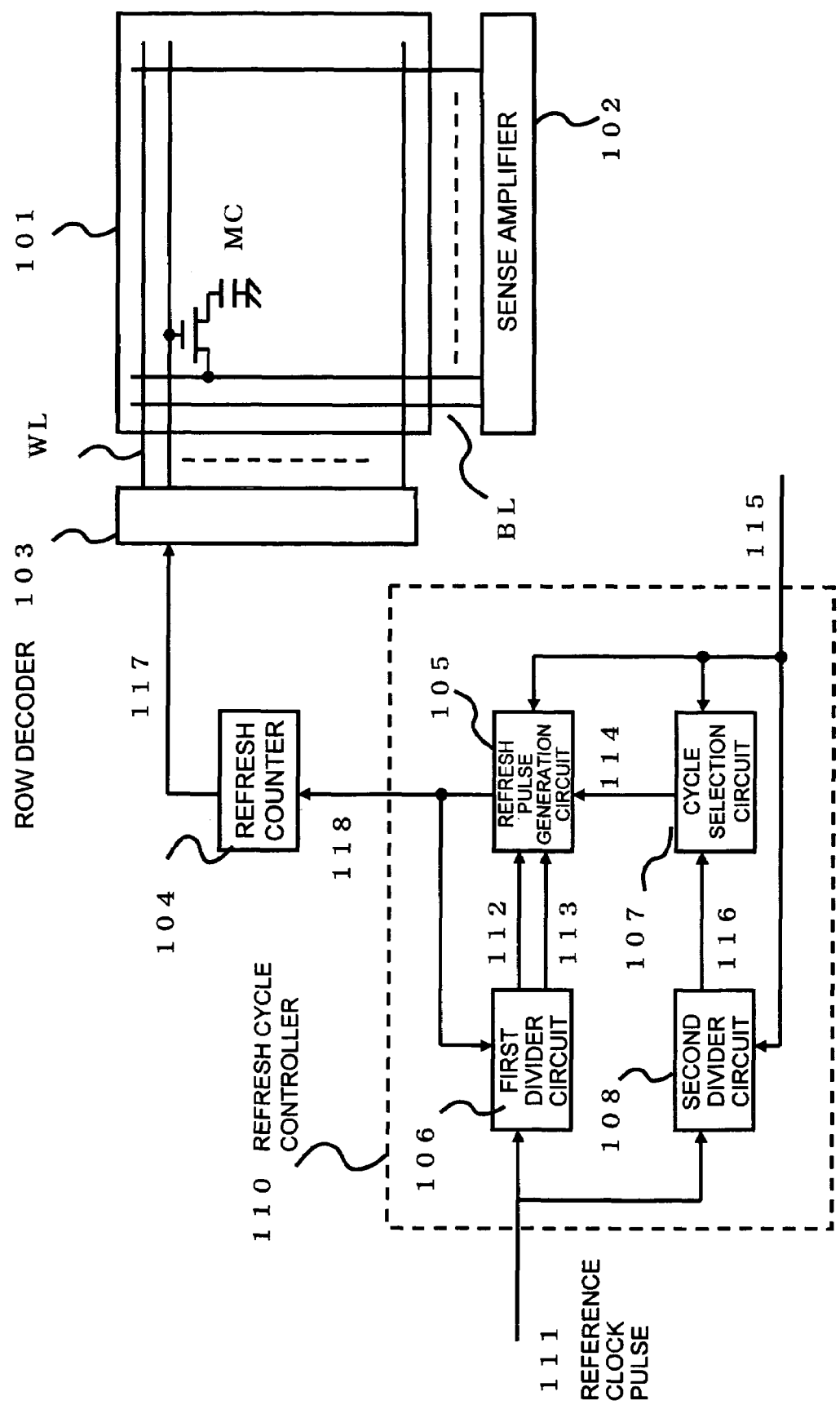
FIG. 1 is a schematic configurational view of a semiconductor memory device of a first embodiment of the present invention.
Figure 2:
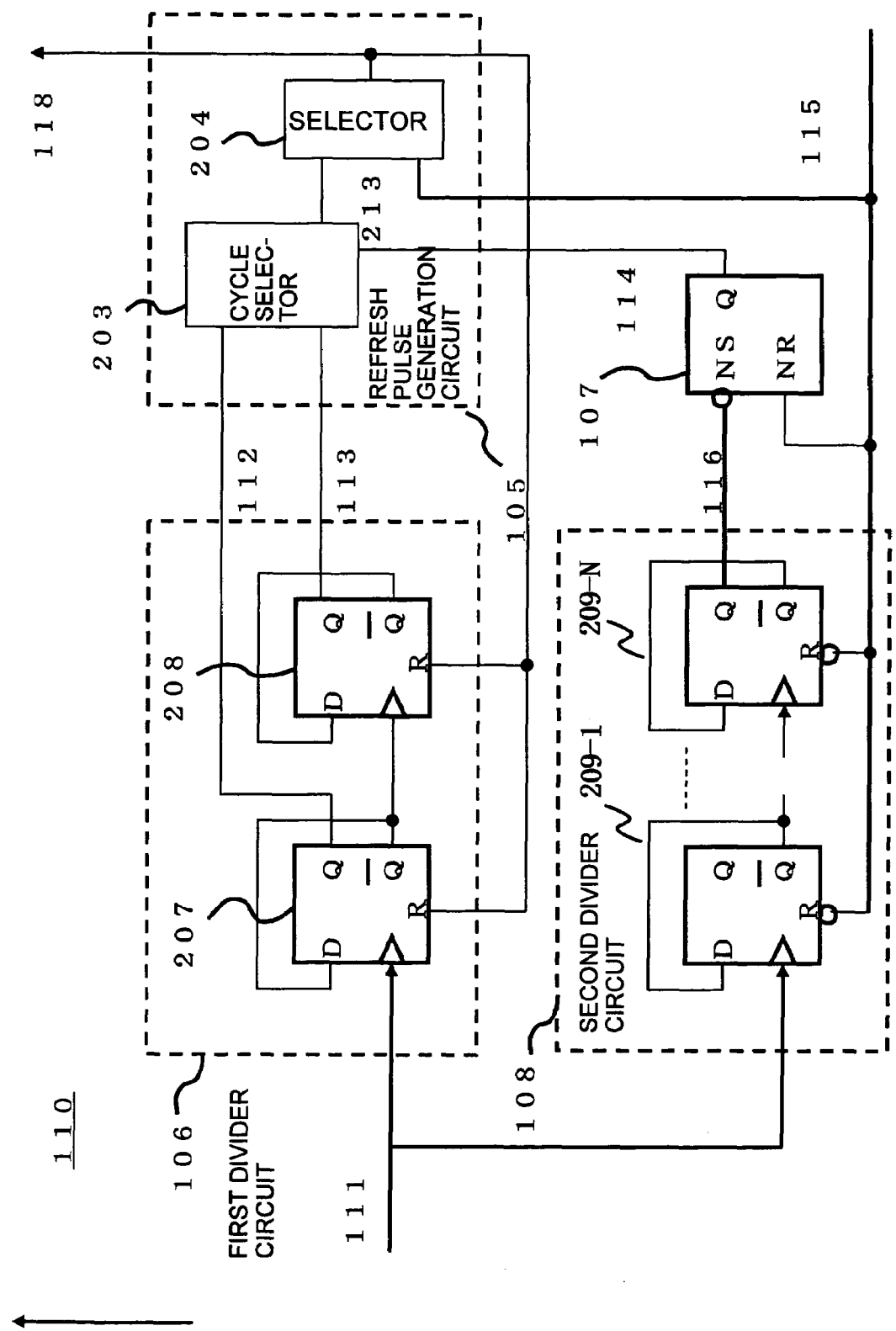
FIG. 2 is a circuit diagram of a refresh cycle controller included in the semiconductor memory device of FIG. 1.
Figure 3:
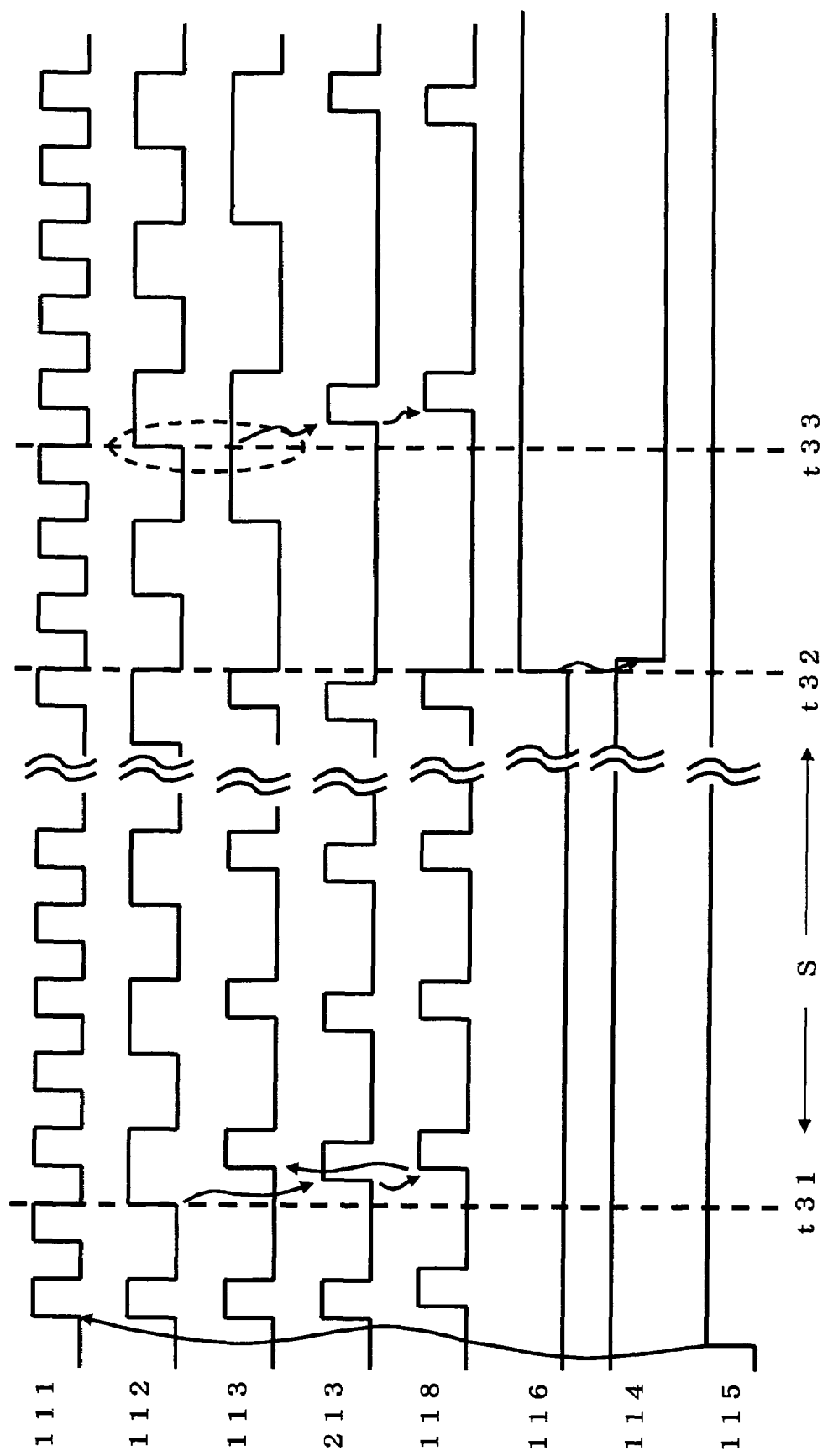
FIG. 3 is a waveform view showing an operation of a semiconductor memory device of the refresh cycle controller of FIG. 2.
Figure 5:
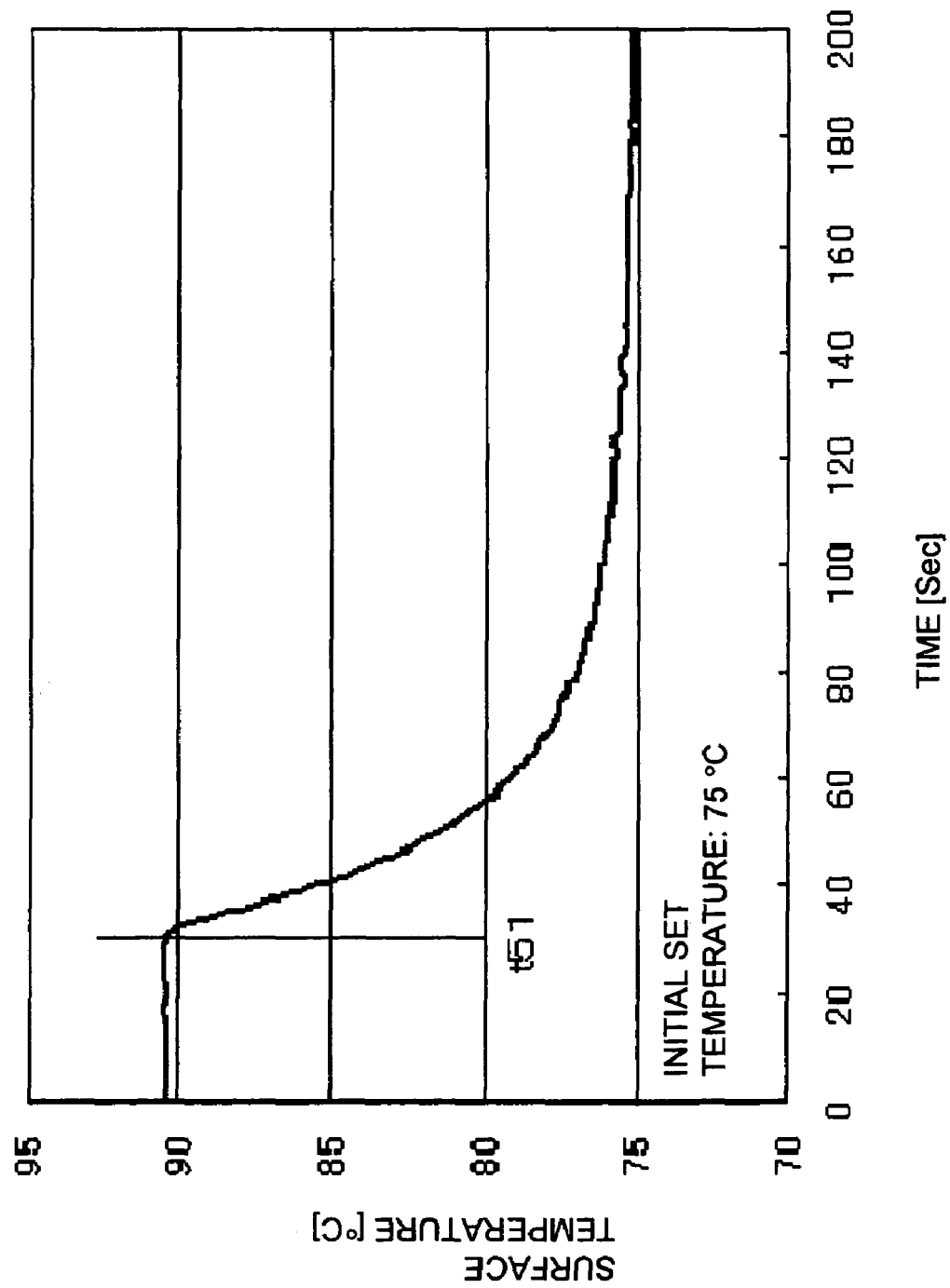
FIG. 5 is a view showing an example of variation in time of a package surface temperature of the semiconductor memory device after a read/write operation, which increases a temperature of the semiconductor device, is stopped.

A first embodiment of the present invention will be explained with reference to FIGS. 1 to 3 and 5. FIG. 1 is a configurational view of a portion relating to a refresh operation of a semiconductor memory device of the embodiment, FIG. 2 is a circuit diagram of a refresh cycle controller included in the semiconductor memory device of FIG. 1, and FIG. 3 is a waveform view explaining an operation of the refresh cycle controller of FIG. 2. FIG. 5 shows variation in time of a package surface temperature of the semiconductor memory device after a read/write operation, which increases a temperature of the semiconductor device, is stopped.

Referring to FIG. 1, the semiconductor memory device includes a memory cell array 101, a sense amplifier 102, a row decoder 103, a refresh counter 104, and a refresh cycle controller 110.

The refresh cycle controller 110 includes first and second divider circuits 106 and 108, a cycle selection circuit 107, and a refresh pulse generation circuit 105.

The memory cell array 101 includes a plurality of memory cells MC each composed of one N-channel transistor and one capacitor and configured in an array state. Further, the memory cell array 101 has a plurality of bit lines BL and a plurality of word lines WL connected to the memory cells MC. The bit lines BL are connected to the sense amplifier 102 which amplifies the potential of the bit lines BL. The row decoder 103 selects one from the word lines WL according to a row address signal input thereto.

When memory cell data is read out, the information of a memory cell MC connected to a selected word line WL is amplified by the sense amplifier and output through a column decoder and an input/output circuit which are not shown. Further, when data is written, the data from the input/output circuit is written to the memory cell MC through an inverse path.

In a refresh operation, the refresh counter 104 sequentially produces a refresh address signal 117 in response to a refresh pulse 118 from the refresh cycle controller 110. The row decoder 103 activates a corresponding word line WL in response to the refresh address signal 117. Thereafter, a refresh operation is executed.

The first divider circuit 106 is a divider circuit for determining a refresh cycle. The first divider circuit 106 divides a reference clock pulse 111 input from the outside or generated therein and produces first and second divided output pulses 112 and 113 for determining the refresh cycle. The divided output pulses 112 and 113 are output to the refresh pulse generation circuit 105. Although a division ratio is not particularly limited, the divided output pulses 112 and 113 are signals formed by dividing the reference clock pulse 111 to ½ and ¼ in the embodiment. At any rate, the second divided pulse 113 has a cycle period longer than that of the first divided pulse 112.

The second divider circuit 108 is a divider circuit for detecting an elapsed time (or a refresh period) in a self-refresh mode. The second divider circuit 108 is input with a control pulse 115. The control pulse 115 is at a high level in the self-refresh mode and at a low level except the self-refresh mode. The divider circuit 108 is reset while the control pulse 115 is at the low level. When the control pulse 115 becomes high level to shift to the self-refresh mode, the divider circuit 108 divides the reference clock pulse 111 to ½N (N: natural number) and outputs it to the cycle selection circuit 107 as a divided output signal 116.

The cycle time of the divided output signal 116 is set such that the half cycle time S [sec] thereof is approximately equal to a time during which the package surface temperature of the semiconductor memory device decreases to an initial set temperature (environmental temperature). FIG. 5 shows an example of variation in time of the package surface temperature of the semiconductor memory device. In FIG. 5, first, the read/write operation is continuously executed under the environment of 75° C., and the package surface temperature of the semiconductor memory device is in an increased state. When the read/write operation is stopped (t51 of FIG. 5), the package surface temperature decreases as a time elapses. About 20 seconds are required until the package surface temperature decreases by 10° C. from just after the read/write operation stops and 20 seconds are further required until it decreases near to the initial set temperature. That is, about several tens of seconds are required for the package surface temperature, which is made high by the read/write operation, to decease near to the initial set temperature. Accordingly, the half cycle time S[sec] of the divided output signal 116 is set to several tens of seconds.

When the control pulse 115 becomes high level, the cycle selection circuit 107 outputs a high level cycle selection signal 114. When the half cycle time S [sec] elapse after a self-fresh operation starts and the divided output signal 116 from the divider circuit 108 becomes high level, the cycle selection circuit 107 changes the cycle selection signal 114 to low level. More specifically, when the self-refresh operation starts, the high level cycle selection signal 114 is at high level and becomes low level when the half cycle time S [sec] elapse after the self-refresh operation starts. The cycle selection signal 114 is supplied to the refresh pulse generation circuit 105.

The refresh pulse generation circuit 105 forms a refresh pulse generator together with the second divider circuit 108 and the cycle selection circuit 107. The refresh pulse generation circuit 105 generates the refresh pulse 118 in response to the divided output pulses 112 and 113, the cycle selection signal 114, and the control pulse 115. The refresh pulse 118 is supplied to the refresh counter 104 as well resets the first divider circuit 106.

The refresh pulse generation circuit 105 selects the divided output pulse 112 or 113 in response to the cycle selection signal 114 and supplies the selected pulse (or a pulse produced based on the pulse) to the refresh counter 104 as the refresh pulse 118. At the same time, the refresh pulse 118 rests first and second D-flip-flop circuits 207 and 208 in the first divider circuit 106.

In the embodiment, when the self-refresh operation starts, that is, when the cycle selection signal 114 is at high level, the divided output pulse 112 is selected, and the refresh pulse 118 is output at a cycle produced by dividing the reference clock pulse 111 to ½.

In contrast, when the half cycle time S [sec] elapse after the self-refresh operation starts and the cycle selection signal 114 changes to low level, the divided output pulse 113 is selected, and the refresh pulse 118 is output at a cycle produced by dividing the reference clock pulse 111 to ¼.

The refresh counter 104 generates the refresh address signal 117 in response to the refresh pulse 118. The row decoder 103 selects a word line WL corresponding to the refresh address signal 117 and activates it. Thereafter, the refresh operation will be executed.

As described above, in the semiconductor memory device of the embodiment, when the self-refresh operation starts, the cycle selection signal 114 is at high level, and the refresh operation is executed at the cycle produced by dividing the reference clock pulse 111 to ½. After the half cycle time S [sec] elapse from the start of the self-refresh operation, the cycle selection signal 114 changes from high level to low level, thereby the refresh operation is executed at the cycle produced by dividing the reference clock pulse 111 by ¼.

Next, a specific circuit configuration of the first and second divider circuit 106 and 108, the cycle selection circuit 107, and the refresh pulse generation circuit 105, which constitute the refresh cycle controller 110, will be explained with reference to FIG. 2.

In FIG. 2, the refresh pulse generation circuit 105 is composed of a cycle selector 203 and a selector 204. Further, the first divider circuit 106 is composed of the first and second D-flip-flop circuits 207 and 208 which are reset in response to the refresh pulse 118. The second divider circuit 108 is composed of N sets of D-flip-flop circuits 209-1 to 209-N which are reset in response to the control pulse 115. The cycle selection circuit 107 is composed of a NAND SR-flip-flop. It is noted that each D-flip-flop circuit has data input D, reset input R, and outputs Q and Q and that the NAND SR-flip-flop 107 has set input NS and reset input NR and output Q.

In the first divider circuit 106, the first D-flip-flop circuit 207 outputs the divided output pulse 112 produced by dividing the reference clock pulse 111 to ½, and the second D-flip-flop circuit 208 outputs the divided output pulse 113 produced by dividing the reference clock pulse 111 to ¼. The divided output pulses 112 and 113 are supplied together to the cycle selector 203. The D-flip-flop circuits 207 and 208 are reset in response to the refresh pulse 118 and restarts to divide the reference clock pulse 111 from the time.

When the control pulse 115 is at high level, the second divider circuit 108 divides the reference clock pulse 111 and outputs the divided output signal 116. In the embodiment, since the N sets of the D-flip-flop circuits 209-1 to 209-N are connected to each other in series, the reference clock pulse 111 is divided to ½N. When the control pulse 115 is at low level, the D-flip-flop circuits 209-1 to 209-N are reset, respectively. The divided output signal 116 output from the D-flip-flop 209-N is supplied to the cycle selection circuit 107.

A division value 2N is determined based on a period of time S [sec] during which the self-refresh operation is executed at a short cycle from the start of the self-refresh operation. Specifically, the circuit is configured such that a value obtained by multiplying the number N of the D-flip-flop circuits 209 by the cycle T[sec] of the reference clock pulse 111 is set to the period of time S[sec] during which the self-refresh operation is executed at the short cycle. That is, N [sets]×T [sec]=S [sec].

For a rough standard of the period of time S [sec], FIG. 5 shows an example of variation of time of the package surface temperature in a case where a read/write operation is continuously executed to a DRAM under the environment of 75° C., and the operation is stopped in a state that the package surface temperature increases (t51 of FIG. 5). As shown in FIG. 5, about 20 seconds are required until the package surface temperature decreases by 10° C. from just after the read/write operation stops and 20 seconds are further required until it decreases near to the initial set temperature. More specifically, in the example, a period of time of several tens of seconds is necessary when the period of time is set to S [sec]. The period of time S [sec] is preferably set from about 5 seconds to 100 seconds in consideration of the radiation of various types of packages.

Returning to FIG. 2, the cycle selection circuit 107 outputs the cycle selection signal 114 in response to the divided output signal 116 and the control pulse 115. When the self-refresh operation starts and the control pulse 115 is at high level, the cycle selection circuit 107 outputs the cycle selection signal 114 at high level, and when the divided output signal 116 becomes high level in S seconds after the self-refresh operation starts, the cycle selection signal 114 is changed to low level. Thereafter, the cycle selection signal 114 remains low level regardless of the divided output signal 116 until the self-refresh operation is finished.

In the refresh pulse generation circuit 105, when the cycle selection signal 114 is at high level, the cycle selector 203 selects a combination in which the divided output pulse 112 is set to high level and the divided output pulse 113 is set to low level. Further, when the cycle selection signal 114 is at low level, the cycle selector 203 selects a combination in which both the divided output pulses 112 and 113 set to high level. The cycle selector 203 supplies a pulse produced based on a selected combination to the selector 204 as a selected output signal 213. Accordingly, when the cycle selection signal 114 is at high level, the cycle selector 203 selects the divided output pulse 112 as a short synchronous cycle, and when the cycle selection signal 114 is at low level, the cycle selector 203 selects the divided output pulse 113 as a long synchronous cycle.

When the selected output signal 213 changes from low level to high level at the time the control pulse 115 is at high level, the selector 204 outputs the refresh pulse 118. The refresh pulse 118 resets the D-flip-flops 207 and 208 of the first divider circuit 106. The first divider circuit 106 starts to divide the reference clock pulse 111 from this time.

Operations of the circuits of FIGS. 1 and 2 will be explained with reference to FIG. 3. First, the control pulse 115 is set to high level to execute the self-refresh operation. The divider circuit 106 generates the divided output pulses 112 and 113 produced by dividing the reference clock pulse 111. In the embodiment, the division values of the divided output pulses 112 and 113 are set to 2 and 4 as described above.

When the self-refresh operation starts, since the cycle selection signal 114 becomes high level, the cycle selector 203 selects the divided output pulse 112 and outputs the selected output signal 213 based on the divided output pulse 112. When the selected output signal 213 (one-shot pulse) is input to the selector 204, the selector 204 generates the refresh pulse 118 (refer to a period of time t31 of FIG. 3).

When the refresh pulse 118 is supplied, the refresh counter 104 supplies the refresh address signal 117 to the row decoder 103. The row decoder 103 activates the word line corresponding to the refresh address signal 117. Thereafter, the refresh operation will be executed.

The refresh pulse 118 also resets the divider circuit 106. That is, the divided output pulses 112 and 113 are reset, thereby the output 213 is reset.

When the divided output signal 116 becomes high level in S seconds after the self-refresh operation starts, the cycle selection signal 114 from the cycle selection circuit 107 changes from high level to low level (refer to period of time t32 of FIG. 3). The cycle selector 203 selects the divided output pulse 113 in response to the change of the cycle selection signal 114 to low level. As a result, thereafter, one-shot pulse of the selected output signal 213 and the refresh pulse 118 of the selector 204 are generated in response to the divided output pulse 113 as a start point (refer to period of time t33 of FIG. 3).

The division value of the divided output pulse 113 is set twice the divided output pulse 112. Accordingly, the refresh pulse 118 is generated at a cycle twice that just after the self-refresh operation starts. Thus, when the frequency of the reference clock pulse 111 is set such that the cycle at which the refresh pulse 118 is generated is the same as that of a conventional semiconductor memory device when the cycle selection signal 114 is at low level, the cycle at which the refresh pulse 118 is generated when the cycle selection signal 114 is at high level is about one half the conventional semiconductor memory device.

As described above, according to the embodiment, when the self-refresh operation starts at a time a semiconductor memory device is at high temperature after reading/writing operation, the self-refresh operation is executed at a cycle one half an ordinary cycle during several tens of seconds until the temperature of the semiconductor memory device decreases to about an environmental temperature. After the temperature of the semiconductor memory device decreases, the self-refresh operation is executed at the ordinary cycle. Accordingly, a problem in that data is lost when refresh characteristics are deteriorated at a time the element is at high temperature can be overcome and power consumption can be also suppressed.

Embodiment 2

Figure 4:
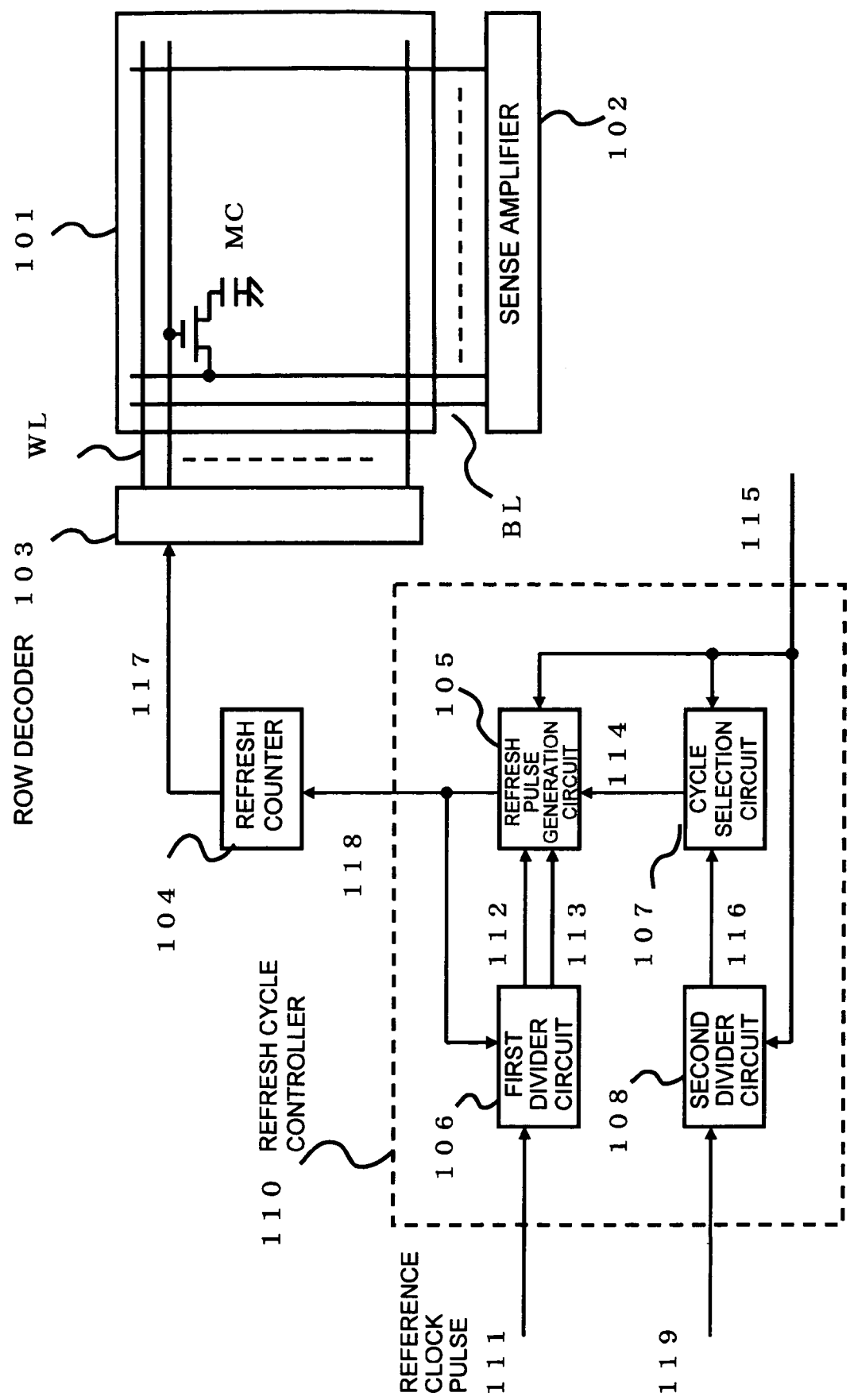
FIG. 4 is a schematic configurational view of a semiconductor memory device of a second embodiment of the present invention.

A second embodiment of the present invention will be described with reference to FIG. 4. In the first embodiment, the second divider circuit 108 divides the reference clock pulse 111 as shown in FIG. 1, whereas, in the second embodiment, a second divider circuit 108 divides an additional reference clock pulse 119 generated separately. Since the other arrangement of the second embodiment is the same as that of the first embodiment, the same elements in the second embodiment are denoted by the same reference numerals as those of the first embodiment and the explanation thereof is omitted. Further, operations of the second embodiment are also omitted because they are the same as those of the first embodiment.

The second embodiment is advantageous in that since a signal having a longer cycle than the reference clock pulse 111 is used as the additional reference clock pulse 119, the number of D-flip-flops included in the second divider circuit 108 can be reduced and a circuit dimension can be reduced.

When a read/write operation is executed continuously and stopped in a state that the temperature of a semiconductor memory device is increased and then a self-refresh mode is employed, a refresh operation can be effectively executed at a low current consumption also in the second embodiment by executing a self-refresh operation in a short cycle first and then at a long cycle after the temperature decreases.

Although the present invention have been specifically explained based on the embodiments, it is needless to say that the present invention is by no means limited thereto and can be variously modified within a scope that does not depart from the gist of the present invention.

What is claimed is:
1. A semiconductor memory device, comprising:
a first divider circuit for dividing a clock pulse;
a second divider circuit for dividing the clock pulse in response to an input of a control pulse;
a refresh pulse generation circuit for generating a refresh pulse in response to an output from the first divider circuit and a cycle selection signal;
a cycle selection circuit for generating the cycle selection signal for changing a cycle, at which the refresh pulse is generated, in response to an output from the second divider circuit;

a refresh address generator for generating a refresh address signal in response to the refresh pulse;

a decoder for activating a word line corresponding to the refresh address signal; and a memory cell array comprising a plurality of memory cells disposed in an array state and a plurality of bit lines and word lines connected to the memory cells, respectively.

2. A semiconductor memory device according to claim 1, wherein the first divider circuit generates a first divided pulse having a short cycle and a second divided pulse having a long cycle.

3. A semiconductor memory device according to claim 1, wherein the second divider circuit measures a time from several seconds to several tens of seconds by a plurality of flip-flops.

4. A semiconductor memory device according to claim 1, wherein the refresh pulse generation circuit controls a refresh pulse generation cycle in response to the cycle selection signal.

5. A semiconductor memory device according to claim 1, wherein the cycle selection circuit changes the cycle selection signal in response to an output front the second divider circuit.

* * * * *